(12) United States Patent
Vaartstra et al.

(10) Patent No.: US 8,617,312 B2
(45) Date of Patent: Dec. 31, 2013

(54) SYSTEMS AND METHODS FOR FORMING LAYERS THAT CONTAIN NIOBIUM AND/OR TANTALUM

(75) Inventors: Brian A. Vaartstra, Nampa, ID (US); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1445 days.

(21) Appl. No.: 11/521,186

(22) Filed: Sep. 14, 2006

(65) Prior Publication Data

US 2007/0006798 A1 Jan. 11, 2007
US 2008/0210157 A9 Sep. 4, 2008

(51) Int. Cl.
*C30B 21/04* (2006.01)

(52) U.S. Cl.
USPC .............. 117/102; 117/84; 117/89; 117/104; 117/952

(58) Field of Classification Search
USPC .............. 117/84, 89, 102, 104, 952; 427/253
See application file for complete search history.

(56) References Cited

U.S. PATENT DOCUMENTS

| | | |
|---|---|---|
| 4,895,709 A | 1/1990 | Laine |
| 4,975,299 A | 12/1990 | Mir et al. |
| 5,003,092 A | 3/1991 | Beachley, Jr. |
| 5,124,278 A | 6/1992 | Bohling et al. |
| 5,139,825 A | 8/1992 | Gordon et al. |
| 5,178,911 A | 1/1993 | Gordon et al. |
| 5,192,589 A | 3/1993 | Sandhu |
| 5,204,314 A | 4/1993 | Kirlin et al. |
| 5,209,979 A | 5/1993 | Moehle et al. |
| 5,225,561 A | 7/1993 | Kirlin et al. |
| 5,256,244 A | 10/1993 | Ackerman |
| 5,280,012 A | 1/1994 | Kirlin et al. |
| 5,326,892 A | 7/1994 | Vaartstra |
| 5,344,792 A | 9/1994 | Sandhu et al. |
| 5,362,328 A | 11/1994 | Gardiner et al. |
| 5,389,401 A | 2/1995 | Gordon |
| 5,399,379 A | 3/1995 | Sandhu |
| 5,409,735 A | 4/1995 | Winter et al. |
| 5,453,494 A | 9/1995 | Kirlin et al. |
| 5,478,610 A | 12/1995 | Desu et al. |
| 5,514,822 A | 5/1996 | Scott et al. |
| 5,527,567 A | 6/1996 | Desu et al. |
| 5,536,323 A | 7/1996 | Kirlin et al. |
| 5,559,260 A | 9/1996 | Scott et al. |
| 5,616,754 A | 4/1997 | Cruse et al. |

(Continued)

FOREIGN PATENT DOCUMENTS

| | | |
|---|---|---|
| EP | 0 320 169 A2 | 6/1989 |
| EP | 0 442 704 A2 | 12/1991 |

(Continued)

OTHER PUBLICATIONS

Crosbie et al., "MOCVD of Strontium Tantalate Thin Films Using Novel Bimetallic Alkoxide Precursors," *Chemical Vapor Deposition*, Jan. 1999;5(1):9-12.

(Continued)

*Primary Examiner* — Bob M Kunemund
(74) *Attorney, Agent, or Firm* — Wells St. John P.S.

(57) ABSTRACT

A method of forming (and system for forming) layers, such as calcium, barium, strontium, and/or magnesium, tantalates and/or niobates, and optionally titanates, on a substrate by employing a vapor deposition method, particularly a multi-cycle atomic layer deposition process.

11 Claims, 2 Drawing Sheets

(56) References Cited

U.S. PATENT DOCUMENTS

| | | |
|---|---|---|
| 5,625,587 A | 4/1997 | Peng et al. |
| 5,637,527 A | 6/1997 | Baek |
| 5,677,002 A | 10/1997 | Kirlin et al. |
| 5,679,815 A | 10/1997 | Kirlin et al. |
| 5,742,322 A | 4/1998 | Cranton et al. |
| 5,744,198 A | 4/1998 | Hampden-Smith et al. |
| 5,772,757 A | 6/1998 | Saito |
| 5,820,664 A | 10/1998 | Gardiner et al. |
| 5,840,897 A | 11/1998 | Kirlin et al. |
| 5,908,947 A | 6/1999 | Vaartstra |
| 5,919,522 A | 7/1999 | Baum et al. |
| 5,924,012 A | 7/1999 | Vaartstra |
| 5,948,322 A | 9/1999 | Baum et al. |
| 5,980,983 A | 11/1999 | Gordon |
| 5,997,639 A | 12/1999 | Iyer |
| 6,004,392 A | 12/1999 | Isobe et al. |
| 6,030,454 A | 2/2000 | Roeder et al. |
| 6,090,963 A | 7/2000 | Zhuang et al. |
| 6,110,529 A | 8/2000 | Gardiner et al. |
| 6,143,081 A | 11/2000 | Shinriki et al. |
| 6,159,855 A | 12/2000 | Vaartstra |
| 6,200,893 B1 | 3/2001 | Sneh |
| 6,203,613 B1 | 3/2001 | Gates et al. |
| 6,239,028 B1 | 5/2001 | Vaartstra |
| 6,244,575 B1 | 6/2001 | Vaartstra et al. |
| 6,271,094 B1 | 8/2001 | Boyd et al. |
| 6,273,951 B1 | 8/2001 | Vaartstra |
| 6,335,049 B1 | 1/2002 | Basceri |
| 6,342,445 B1 | 1/2002 | Marsh |
| 6,348,412 B1 | 2/2002 | Vaartstra |
| 6,350,686 B1 | 2/2002 | Vaartstra |
| 6,387,764 B1 | 5/2002 | Curtis et al. |
| 6,391,803 B1 | 5/2002 | Kim et al. |
| 6,402,126 B2 | 6/2002 | Vaartstra et al. |
| 6,426,292 B2 | 7/2002 | Vaartstra |
| 6,444,264 B2 | 9/2002 | Hintermaier et al. |
| 6,468,924 B2 | 10/2002 | Lee et al. |
| 6,624,072 B2 | 9/2003 | Vaartstra |
| 6,730,164 B2 * | 5/2004 | Vaartstra et al. ............... 117/104 |
| 6,821,341 B2 | 11/2004 | Vaartstra |
| 6,869,638 B2 | 3/2005 | Baum et al. |
| 7,005,303 B2 | 2/2006 | Hintermaier et al. |
| 7,005,392 B2 | 2/2006 | Baum et al. |
| 7,115,166 B2 * | 10/2006 | Vaartstra et al. ................ 117/86 |
| 7,115,528 B2 | 10/2006 | Vaartstra et al. |
| 7,332,032 B2 | 2/2008 | Vaartstra |
| 7,332,442 B2 | 2/2008 | Vaartstra et al. |
| 7,482,284 B2 | 1/2009 | Vaartstra et al. |
| 2002/0086111 A1 | 7/2002 | Byun et al. |
| 2002/0175393 A1 | 11/2002 | Baum et al. |
| 2003/0188682 A1 | 10/2003 | Tois et al. |
| 2004/0040494 A1 | 3/2004 | Vaartstra et al. |
| 2004/0096582 A1 | 5/2004 | Wang et al. |
| 2004/0197946 A1 | 10/2004 | Vaartstra |
| 2005/0022738 A1 | 2/2005 | Vaartstra |
| 2006/0252244 A1 | 11/2006 | Vaartstra et al. |
| 2007/0155190 A1 | 7/2007 | Vaartstra et al. |

FOREIGN PATENT DOCUMENTS

| | | |
|---|---|---|
| EP | 0 320 169 B1 | 1/1994 |
| WO | 2007/019879 | 1/2008 |
| WO | 2007/019879 | 3/2009 |

OTHER PUBLICATIONS

Lee et al., "SrTa$_2$O$_6$ Thin Films Deposited by Plasma-Enhanced Atomic Layer Deposition," *Jpn J. Appl. Phys.*, Dec. 2001;40(12) Part 1:6941-6944.

"Atomic Layer Deposition (ALD 2002) Conference, Aug. 19-21, 2002, at Hanyang University in Seoul, Korea," Conference Schedule [online] [retrieved Jul. 8, 2003]. Retrieved from the Internet:<URL:http://www.avs.org/conferences/ald/2002/program/aug19.html>; 3 pgs.

"Atomic Layer Deposition (ALD 2002) Conference, Aug. 19-21, 2002, at Hanyang University in Seoul, Korea," Oral and slide Presentations [CD-ROM]. Available online from the Internet:<URL:https://www.avs.org/conferences/ald/2002/cd_form.html>; 2 CDs.

Billingham and Jenkins, "Polymerization Initiated by Titanium Amides," *Applied Polymer Symposia*, 1975; 26:13-18.

Cathey, "Field Emission Displays," *International Symposium on VLSI Technology Systems and Applications, Proceedings of Technical Papers*, May 31-Jun. 2, 1995, Taipei, Taiwan,1995:p. 131-136.

Feingold and Katz, "Rapid thermal low-pressure metal-organic chemical vapor deposition (RT-LPMOCVD) of semiconductor, dielectric and metal film onto InP and related materials," *Materials Science and Engineering: Reports*, Oct. 1, 1994; 13(2):57-104.

Fix et al., "Synthesis of Thin Films by Atmospheric Pressure Chemical Vapor Deposition Using Amido and Imido Titanium (IV) Compounds as Precursors," *Chemistry of Materials*, May/Jun. 1990; 2(3):235-241.

Gardiner et al., "Mononuclear Barium Diketonate Polyamine Adducts. Synthesis, Structures, and Use in MOCVD of Barium Titanate," *Chem. Mater.*, 1994; 6:1967-1970.

Gordon et al., "New Liquid Precursors for Chemical Vapor Deposition," *MBS Meeting*, Fall 1997, 6 pgs.

Gordon et al., "Vapor deposition of metal oxides and silicates: possible gate insulators for future microelectronics," *Chem. Mater.*, 2001, 13(8):2463-4.

Hawley, *The Condensed Chemical Dictionary*, 10$^{th}$ Edition, Van Nostrand Reinhold Co., New York, 1981; 225-226.

"Hawley's Condensed Chemical Dictionary—Thirteenth Edition," Eds. John Wiley & Sons, Inc. 1997;756.

Hendrix et al., "Composition control of Hf$_{1-x}$Si$_x$O$_2$ films deposited on Si by chemical-vapor deposition using amide precursors," *Appl. Phys. Lett.*, Apr. 1, 2002; 80(13):2362-4.

Hoffman, David M., "Chemical Vapour Deposition of Nitride Thin Films," *Polyhedron*, Apr. 1994;13(8):1169-1179.

Lee et al., "High-k gate dielectric applications using ALD Hf-based oxides," *Solid State Technology*, Jan. 2003; 46(1): 45-6, 56.

Liu et al., "Atomic Layer Deposition of Hafnium Oxide Thin Films from Tetrakis(dimethylamino)Hafnium (TDMAH) and Ozone," *Mat Res Soc Symp Proc*, 2003;765:97-102.

Maruyama et al., "Silicon dioxide thin films prepared by chemical vapor deposition from tetrakis (dimethylamino) silane and ozone," *Appl. Phys. Lett.*, Aug. 2, 1993; 63(5):611-13.

Ohshita et al., "HfO$_2$ growth by low-pressure chemical vapor deposition using the Hf(N(C$_2$H$_5$)$_2$)$_4$/O$_2$ gas system," *Journal of Crystal Growth*, 2001; 233:292-7.

Ohshita et al., "Using tetrakis-diethylamido-hafnium for HfO$_2$ thin-film growth in low-pressure chemical vapor deposition," *Thin Solid Films*, 2002; 406:215-18.

Ritala et al., "Atomic layer deposition of oxide thin films with metal alkoxides as oxygen sources," *Science*, Apr. 14, 2000; 288:319-21.

Suzuki et al., "Atomic Layer Deposition of HfO$_2$ using Hf(N(C$_2$H$_5$)$_2$)$_4$ and O$_3$," Poster Presentation, *ALD 2002 Conference*, Hanyang University, Seoul, Aug. 19, 2002; 14 pages.

Vaartstra et al., "Syntheses and Structures of a Series of Very Low Coordinate Barium Compounds: Ba[N(SiMe$_3$)$_2$]$_2$(THF)$_2$, {Ba[N(SiMe$_3$)$_2$]$_2$(THF)}$_2$, and {Ba[N(SiMe$_3$)$_2$]$_2$}$_2$," *Inorg. Chem.*, 1991; 30:121-5.

Vehkamäki et al., "Growth of SrTiO$_3$ and BaTiO$_3$ Thin Films by Atomic Layer Deposition," *Electrochemical and Solid-State Letters*, 1999; 2(10):504-6.

Versteeg et al., "Metalorganic Chemical Vapor Deposition by Pulsed Liquid Injection Using an Ultrasonic Nozzle: Titanium Dioxide on Sapphire from Titanium (IV) Isopropoxide," *Journal of the American Ceramic Society*, Oct. 1995; 78:2763-2768.

U.S. Appl. No. 12/352,775, filed Jan. 13, 2009, Vaartstra et al.

* cited by examiner

US 8,617,312 B2

SYSTEMS AND METHODS FOR FORMING LAYERS THAT CONTAIN NIOBIUM AND/OR TANTALUM

This application hereby incorporates by reference all of the following in their entireties: application Ser. No. 10/828,686, filed Apr. 21, 2004, now U.S. Pat. No. 7,115,166, which is a continuation of application Ser. No. 10/230,131, filed Aug. 28, 2002, now U.S. Pat. No. 6,730,164.

FIELD OF THE INVENTION

This invention relates to methods of forming a layer on a substrate using a vapor deposition process, particularly a multi-cycle atomic layer deposition (ALD) process, using one or more Group IIA metal precursor compounds, one or more Group VB metal (e.g., tantalum and/or niobium) precursor compounds, and optionally other metal (e.g., titanium) precursor compounds, typically in the presence of one or more reaction gases. The precursor compounds and methods are suitable for example, for the formation of dielectric layers such as calcium, barium, strontium, and/or magnesium, tantalates and/or niobates, and optionally titanates, on semiconductor substrates or substrate assemblies.

BACKGROUND

Capacitors are the basic energy storage devices in random access memory devices, such as dynamic random access memory (DRAM) devices and ferroelectric memory (FERAM) devices. They consist of two conductors, such as parallel metal or polysilicon plates, which act as the electrodes (i.e., the storage node electrode and the cell plate capacitor electrode), insulated from each other by a dielectric material.

The continuous shrinkage of microelectronic devices such as capacitors over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material to construct microelectronic devices. However, when the $SiO_2$ layer is thinned to 1 nm (i.e., a thickness of only 4 or 5 molecules), as is desired in the newest microelectronic devices, the layer no longer effectively performs as an insulator due to the tunneling current running through it. This $SiO_2$ thin layer deficiency has lead to the search for improved dielectric materials.

High quality dielectric layers containing Group IIA metal titanates such as $SrTiO_3$, $BaTiO_3$, and $(Ba_{1-x}Sr_x)TiO_3$ are of interest to the semiconductor industry as they exhibit higher permitivities than do dielectric layers containing $SiO_2$. Consequently, the semiconductor industry has been extensively evaluating strontium, barium, and titanium precursor compounds that can be used in vapor deposition processes.

Chemical vapor deposition (CVD) is a continuous, single step vapor deposition process that can be used to deposit dielectric films (i.e., layers) having excellent conformality and is therefore of significant interest in making strontium and barium titanate thin films. In CVD, excellent conformality is achieved when the process is carried out at a temperature low enough that the surface reactions are the rate-limiting step in the film growth. At higher temperatures the precursor compound transformation becomes the limiting factor, causing a degradation of the conformality.

Atomic layer deposition (ALD) is a more sophisticated vapor deposition process capable of forming even higher quality dielectric layers due to the self-limiting film growth and the optimum control of atomic-level thickness and film uniformity. Using the ALD process, several sequential process cycles are employed to deposit the layer on the substrate one monolayer at a time per cycle until the desired layer thickness is achieved. For each cycle of the ALD process, vapors of one or more precursor compounds are pulsed into the deposition chamber and are chemisorbed onto the substrate. Typically, one or more vaporized reaction gases (e.g., water vapor) are pulsed into the deposition chamber to react with the chemisorbed precursor compound(s) and cause the deposition of the desired layer onto the substrate. With the ALD process, more reactive precursors can be used, without the problem of gas-phase reactions, resulting in lower temperature requirements at the substrate.

Vehkamäki et al., "Growth of $SrTiO_3$ and $BaTiO_3$ Thin Films by Atomic Layer Deposition," Electrochemical and Solid-State Letters, 2(10):504-506 (1999) describe thin films of $SrTiO_3$ and $BaTiO_3$ deposited by ALD processes making use of a novel class of strontium and barium precursors, i.e., their cyclopentadienyl compounds, together with titanium tetraisopropoxide and water. Prior to their discovery, Vehkamäki et al. state that the selection of strontium and barium precursor compounds has been limited to their β-diketonate compounds that do not react with water or oxygen at temperatures low enough for the self-limiting growth mechanism of ALD processes.

The search continues for sufficiently volatile Group IIA metal precursor compounds, especially strontium and/or barium precursor compounds, to employ successfully in vapor deposition processes, particularly ALD processes, to form dilectric layers, for example.

SUMMARY

This invention provides vapor deposition processes, and particularly a multi-cycle atomic layer deposition (ALD) processes, for forming a metal-containing layer on a substrate using one or more Group IIA metal diorganoamide precursor compounds, one or more Group VB metal precursor compounds, and optionally one or more other metal-containing precursor compounds (e.g., titanium precursor compounds) and/or one or more reaction gases, such as water vapor. Preferably, the formed layer is an oxide layer, which can be used as a dielectric layer. Examples of such layers include barium tantalates, barium niobates, strontium tantalates, strontium niobates, magnesium tantalates, magnesium niobates, calcium tantalates, calcium niobates, barium tantalate titanates, barium niobate titanates, strontium tantalate titanates, strontium niobate titanates, magnesium tantalate titanates, magnesium niobate titanates, calcium tantalate titanates, calcium niobate titanates, barium-strontium tantalates, barium-strontium niobates, barium-strontium tantalate titanates, barium-strontium niobate titanates, magnesium-strontium tantalates, magnesium-strontium niobates, calcium-strontium tantalate titanates, calcium-strontium niobate titanates, and combinations thereof.

In one embodiment, the present invention provides a method of forming a layer on a substrate, such as is used in the manufacturing of a semiconductor structure. The method includes: providing (preferably in a deposition chamber) a substrate (preferably a semiconductor substrate or substrate assembly such as a silicon wafer); providing a vapor including one or more Group IIA metal precursor compounds of the formula $M(NRR')_2$, wherein R and R' are each independently an organic group (preferably having 1 to 10 carbon atoms, which are optionally replaced by or substituted with silicon, oxygen, and/or nitrogen atoms and/or groups containing such atoms), and M is selected from the group consisting of barium, strontium, calcium, and magnesium (preferably, strontium and barium); providing a vapor comprising one or more Group VB metal precursor compounds (preferably tantalum and/or niobium precursor compounds); and directing the vapors to and/or contacting the vapors with the substrate to form a metal-containing layer (preferably, a metal oxide layer, which is useful as a dielectric layer) on one or more surfaces of the substrate using a vapor deposition process (e.g., a chemical vapor deposition process or an atomic layer deposition process that includes a plurality of deposition cycles). Optionally, the method further includes providing one or more reaction gases (preferably, water vapor) and directing the gases to or contacting the gases with the substrate.

Optionally, the methods of the present invention can further include a step of providing a vapor including one or more metal-containing precursor compounds other than the compounds of Formula I and other than the one or more Group VB metal precursor compounds, and directing this vapor to the substrate to form a metal-containing layer. Such compounds are preferably titanium compounds, such as those of the formula $Ti(AR^1_x)_4$, wherein: A is O, N, C(O), or OC(O); and $R^1$ is a (C1-C10)alkyl group, wherein two of the $R^1$ alkyl groups are optionally joined together to form an alkylene group; and n=1 or 2. Using such additional precursor compounds, mixed-metal oxides can be formed such as barium tantalate titanates, barium niobate titanates, strontium tantalate titanates, strontium niobate titanates, magnesium tantalate titanates, magnesium niobate titanates, calcium tantalate titanates, calcium niobate titanates, barium-strontium tantalate titanates, barium-strontium niobate titanates, calcium-strontium tantalate titanates, calcium-strontium niobate titanates, and combinations thereof.

The precursor compounds can be directed to the substrate together (e.g., substantially simultaneously) or separately. They can be directed to the substrate in the same cycle or in separate (e.g., alternating) cycles. Some or all of the precursor compounds can be directed to the substrate before directing one or more reaction gases to the substrate.

In another embodiment, the present invention provides a method of manufacturing a memory device structure. The method includes: providing a substrate (preferably a semiconductor substrate or substrate assembly such as a silicon wafer) having a first electrode thereon; providing one or more Group IIA metal precursor compounds of the formula $M(NRR')_2$, wherein R and R' are each independently an organic group and M is selected from the group consisting of barium, strontium, calcium, and magnesium; providing one or more Group VB metal precursor compounds (preferably tantalum and/or niobium precursor compounds); vaporizing the precursor compounds; contacting the vaporized precursor compounds and the one or more reaction gases with the substrate using a vapor deposition process to form a dielectric layer on the first electrode of the substrate; and forming a second electrode on the dielectric layer.

In yet another embodiment, the present invention provides a vapor deposition system (preferably an atomic layer deposition system), that includes: a deposition chamber optionally having a substrate (preferably a semiconductor substrate or substrate assembly such as a silicon wafer) positioned therein; one or more vessels that include one or more Group IIA metal precursor compounds of the formula $M(NRR')_2$, wherein R and R' are each independently an organic group and M is selected from the group consisting of barium, strontium, calcium, and magnesium; and one or more vessels that include one or more Group VB metal precursor compounds (preferably tantalum and/or niobium precursor compounds).

"Substrate" as used herein refers to any base material or construction upon which a metal-containing layer can be deposited. The term "substrate" is meant to include semiconductor substrates and also include non-semiconductor substrates such as films, molded articles, fibers, wires, glass, ceramics, machined metal parts, etc.

"Semiconductor substrate" or "substrate assembly" as used herein refers to a semiconductor substrate such as a metal electrode, base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any metal-containing layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

"Dielectric layer" as used herein is a term used in the semiconductor industry that refers to an insulating layer (sometimes referred to as a "film") having a high dielectric constant that is typically positioned between two conductive electrodes to form a capacitor. For this invention, the dielectric layer contains a Group IIA metal and a Group VB metal, where preferably the compound is a tantalate and/or niobate, and optionally a titanate.

"Precursor compound" as used herein refers to a metal compound capable of forming (typically in the presence of a reaction gas) a metal-containing layer on a substrate in a vapor deposition process. The resulting metal-containing layers are typically oxide layers, which are useful as dielectric layers.

"Deposition process" and "vapor deposition process" as used herein refer to a process in which a metal-containing layer is formed on one or more surfaces of a substrate (e.g., a doped polysilicon wafer) from vaporized precursor compound(s). Specifically, one or more metal precursor compounds are vaporized and directed to one or more surfaces of a heated substrate (e.g., semiconductor substrate or substrate assembly) placed in a deposition chamber. These precursor compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds and any reaction gases used within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below). Also, for pulsed CVD, the deposition thickness is dependent on the exposure time, as opposed to ALD, which is self-limiting (discussed in greater detail below).

"Atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chemisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE) (see U.S. Pat. No. 5,256,244 (Ackerman)), molecular beam epitaxy (MBE), gas source MBE, organometallic MBE, and chemical beam epitaxy when performed with alternating pulses of precursor compound(s), reaction gas and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (>30 kcal/mol), comparable in strength to ordinary chemical bonds. The chemisorbed species are limited to the formation of a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate reactive precursor compounds are alternately introduced (e.g., pulsed) into a deposition chamber and chemisorbed onto the surfaces of a substrate. Each sequential introduction of a reactive precursor compound is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood, however, that ALD can use one precursor compound and one reaction gas.

DETAILED DESCRIPTION OF ILLUSTRATIVE EMBODIMENTS

Figure 1:
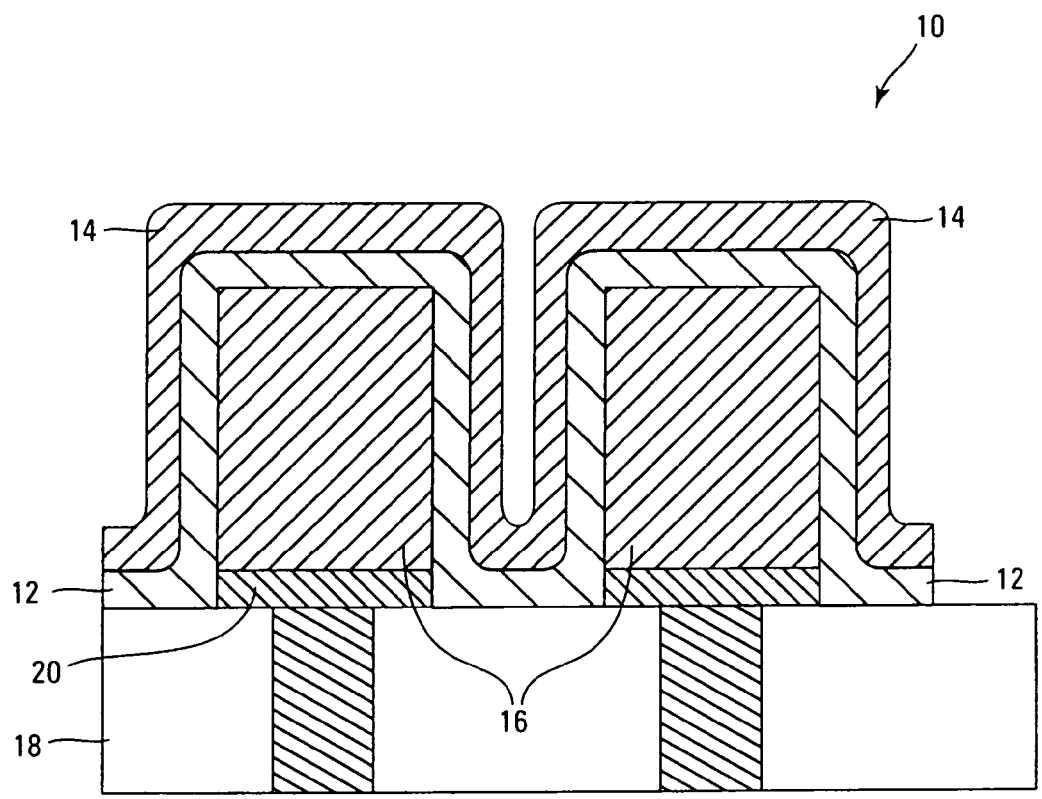
FIG. 1 is an exemplary capacitor construction.

The present invention provides methods of forming a metal-containing layer on a substrate using one or more Group IIA metal precursor compounds of the formula $M(NRR')_2$ (Formula I), wherein: R and R' are each independently an organic group; and M is selected from the group consisting of barium, strontium, calcium, and magnesium (preferably, M is Ba or Sr); and one or more Group VB metal precursor compounds. Other metal-containing precursor compounds (other than those of Formula I and other than the one or more Group VB metal precursor compounds) can also be used as can one or more reaction gases in the methods of the present invention.

The metal-containing layer formed is a Group IIA metal-containing layer, preferably a strontium- and/or barium-containing layer. In addition, the Group IIA metal-containing layers include a Group VB metal. The layers or films formed can be in the form of Group IIA metal oxide-containing films, for example, wherein the layers include one or more Group IIA metal oxides doped with one or more Group VB metals, and optionally other metals. Thus, the term "Group IIA metal oxide" films or layers encompass doped films or layers (i.e., mixed metal oxides), such as calcium, barium, strontium, and/or magnesium, tantalates and/or niobates, and optionally titanates.

The substrate on which the metal-containing layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and ferroelectric memory (FERAM) devices, for example.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

The Group IIA metal precursor compounds useful in this invention are of the formula $M(NRR')_2$ (Formula I) wherein R and R' are each independently an organic group. As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal-containing layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, 2-ethylhexyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group"

means a closed ring hydrocarbon in which one or more of the atoms in the ring is an element other than carbon (e.g., nitrogen, oxygen, sulfur, etc.).

As a means of simplifying the discussion and the recitation of certain temninology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group for example, substituted with silicon atoms or donor atoms such as nonperoxidic oxygen (e.g., in the chain (i.e., ether) as well as carbonyl groups or other conventional substituents), nitrogen or sulfur. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

Preferably, the Group IIA metal precursor compounds useful in this invention are of the formula $M(NRR')_2$ wherein R and R' are each independently an organic group, preferably having from 1 to 10 carbon atoms, which are optionally replaced by or substituted with silicon, oxygen, and/or nitrogen atoms or groups containing such atoms; and M is selected from the group consisting of strontium, barium, calcium, and magnesium (more preferably, strontium and barium). More preferably, the Group IIA metal precursor compounds are of the formula $M[N(SiR''_3)_2]_2$, wherein M is selected from the group consisting of barium and strontium, and R" is a (C1-C3)alkyl moiety.

Examples of useful such precursors compounds include $Ba[N(SiMe_3)_2]_{,2}$ and/or $Sr[N(SiMe_3)_2]_2$, where Me is methyl. During the use of such compounds, hexamethyl disilazane (HMDS) is the single volatile by-product during the vapor deposition process. This makes the process very compatible with conventional semiconductor fabrication processes. Such compounds are described in Vaartstra et al., Inorg. Chem., 30:121-125(1991), for use in CVD processes; however, there was no indication that such compounds could be used in ALD processes.

Such compounds can be made using conventional techniques. For example, $Ba[N(SiMe_3)_2]_2$ can be prepared as described by Vaartstra et al. in Inorg. Chem., 30:121-125 (1991), "Syntheses Synthesis and Structures of a Series of Very Low Coordinate Barium Compounds: $Ba[N(SiMe_3)_2]_2$ $(THF)_2$, $\{Ba[N(SiMe_3)_2](THF)_2\}$, and $\{Ba[N(SiMe_3)_2]_2\}_2$," by reacting in a drybox barium granules with $HN(SiMe_3)_2$ (available from Aldrich Chemical Co. Milwaukee, Wis.) in the presence of gaseous ammonia and tetrahydrofuran. Also, $Sr[N(SiMe_3)_2]_2$ can be prepared using essentially the same synthetic procedure but replacing the barium granules with an equimolar quantity of strontium granules. Another synthetic approach involves the reaction of a Group IIA metal halide and $Li[N(SiMe_3)_2]$.

A wide variety of Group VB metal precursor compounds are known in the art and can be used in the present invention. Preferably, the Group VB metal precursor compounds are tantalum precursor compounds, niobium precursor compounds, or combinations thereof.

Examples of useful tantalum precursor compounds include, but are not limited to, tantalum halides (e.g., $TaF_5$, $TaCl_5$, and $TaBr_5$), tantalum alkoxides (e.g., $Ta(OCH_3)_5$, $Ta(OC_2H_5)_5$, $Ta(OC_4H_9)_5$, $Ta(OC_2H_5)_4(OCH_2CH_2O$-iso-$C_3H_7)$, and $Ta(OCH_3)_4(OCH_2CH_2O$-iso-$C_3H_7))$, tantalum amides (e.g., pentakis(dimethylamino)tantalum), tantalum imido-amides (e.g., tris(diethylamino)(ethylimino)tantalum and tris(diethylamino)(tert-butylimino)tantalum), tantalum carboxylates, tantalum alkyls, tantalum hydrides, and combinations thereof.

Examples of useful niobium precursor compounds include, but are not limited to, niobium halides (e.g., $NbF_5$, $NbCl_5$, and $NbBr_5$), niobium alkoxides (e.g., $Nb(OC_2H_5)_4$ $(CH_3OCH_2CH_2O)$ and $Nb(OC_2H_5)_4((CH_3)_2NCH_2CH_2O)$, also known as niobium tetraethoxy dimethylaminoethoxide or NbTDMAE), niobium amides (e.g., pentakis(ethylmethylamino)niobium), niobium carboxylates, niobium alkyls, niobium hydrides, and combinations thereof.

Other metal-containing precursor compounds can be used to make various mixed-metal complexes. For example, titanium precursor compounds suitable for use in this invention include organo-titanium compounds having the formula $Ti(AR^1_x)_4$, wherein: A is a difunctional (x=1) or trifunctional (x=2) polar group such as —O—, —N<, —C(O)— or —OC(O)—; and $R^1$ is a (C1-C10)alkyl group, wherein two of the $R^1$ alkyl groups are optionally joined together to form an alkylene group. Preferably, A is —O— and R' is methyl, ethyl, n-propyl, isopropyl, or butyl.

Examples of suitable titanium precursor compounds include titanium tetramethoxide, titanium tetraethoxide, titanium tetra-n-propoxide, titanium tetraisopropoxide, titanium tetra-n-butoxide, titanium tetra-t-butoxide, titanium tetra-2-ethylhexoxide, tetrakis(2-ethylhexane-1,3-diolato) titanium (i.e., octyleneglycol titanate), titanium diisopropoxide bis (acetylacetonate), titanium diisopropoxide bis(2,2,6,6-tetramethyl-3,5-heptanedionate, titanium bis(ethyl acetacetato) diisopropoxide, bis(ethylacetoacetato) bis(alkanolato) titanium, tetrakis(dimethylamino)titanium, tetrakis (diethylamino)titanium, tetrakis(ethylmethylamino) titanium, and titanium (triethanolaminato)isopropoxide, all available from Sigma-Aldrich Chemical Co., Milwaukee, Wis. or as TYZOR organic titanates from E. I. du Pont de Nemours & Co., Wilmington, Del. Preferably, the titanium precursor compound is a tetralkylorthotitanate of the formula $Ti(OR^2)_4$, wherein all of the $R^2$ groups are the same and are (C1-C10)alkyl moieties, preferably (C1-C4)alkyl moieties, e.g., methyl, ethyl, isopropyl and t-butyl.

The titanium precursor compounds can also be prepared by reacting one mole of titanium tetrachloride with four moles of the organic compound (e.g., an alcohol) needed to provide the desired $R^2$ groups. For example, titanium tetraisopropoxide (i.e., tetraisopropylorthotitanate) can be prepared by reacting titanium tetrachloride with isopropyl alcohol followed by distillation of the crude reaction product.

The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques.

Various combinations of reaction gases can also be used in the methods of the present invention. The reaction gas can be selected from a wide variety of gases reactive with the precursor compounds described herein, at least at a surface under the conditions of atomic layer adsorption. Examples of suitable reaction gases include oxidizing and reducing gases such as water vapor, oxygen, ozone, hydrogen peroxide, nitrous oxide, ammonia, organic amines, silanes, hydrogen, hydrogen sulfide, hydrogen selenide, hydrogen telluride, and combinations thereof. Water vapor is the preferred reaction gas for the deposition of oxides using the precursor compounds described herein.

The precursor compounds can be vaporized in the presence of an inert carrier gas if desired. Additionally, an inert carrier gas can be used in purging steps, as described below. The inert carrier gas is typically selected from the group consisting of nitrogen, helium, argon, and mixtures thereof. In the context of the present invention, an inert carrier gas is one that is generally unreactive with the complexes described herein and does not interfere with the formation of the desired metal-containing film (i.e., layer).

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal-containing (preferably dielectric) layers onto semiconductor substrates. Using either vapor deposition process, typically one or more precursor compounds are vaporized in a deposition chamber and optionally combined with one or more reaction gases to form a metal-containing layer onto a substrate. It will be readily apparent to one skilled in the art that the vapor deposition process may be enhanced by employing various related techniques such as plasma assistance, photo assistance, laser assistance, as well as other techniques.

The final layer (which is preferably a dielectric layer) formed preferably has a thickness in the range of about 10 Å to about 500 Å. More preferably, the thickness is in the range of about 50 Å to about 200 Å.

Preferably, the vapor deposition process employed in the methods of the present invention is a multi-cycle ALD process. Such a process is advantageous (particularly over a CVD process) in that it provides for optimum control of atomic-level thickness and uniformity to the deposited layer (e.g., dielectric layer) and to expose the metal precursor compounds to lower volatilization and reaction temperatures to minimize degradation. Typically, in an ALD process, each reactant is pulsed sequentially onto a suitable substrate, typically at deposition temperatures of about 25° C. to about 400° C. (preferably about 100° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10):504-506 (1999)).

A typical ALD process includes exposing an initial substrate to a first chemical species (e.g., a Group IIA or a Group VB metal precursor compound) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different compound of Formula I, a different Group VB metal precursor compound, a metal-containing compound of a formula other than that of Formula I and other than the Group VB metal precursor compound, or a reaction gas) is provided to react with the first monolayer of the first species. The second species is then purged and the steps are repeated with exposure of the second species monolayer to the first species. In some cases, the two monolayers may be of the same species. As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) Group IIA or Group VB metal precursor compound(s) and reaction compound(s) into the deposition chamber containing a semiconductor substrate, chemisorbing the precursor compound(s) as a monolayer onto the substrate surfaces, and then reacting the chemisorbed precursor compound(s) with the other co-reactive precursor compound(s). The pulse duration of precursor compound(s) and inert carrier gas(es) is sufficient to saturate the substrate surface. Typically, the pulse duration is from about 0.1 to about 60 seconds, preferably from about 0.2 to about 30 seconds.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the second species or precursor compound can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

For a typical ALD process, the pressure inside the deposition chamber is kept at about $10^{-4}$ torr to about 1 torr, preferably about $10_{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

As stated above, the use of the complexes and methods of forming films of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a dielectric layer is formed according to the present invention is a capacitor construction. An exemplary capacitor construction is a dynamic random access memory device, which is described with reference to FIG. 1. Referring to FIG. 1, such a memory cell 10 includes a high dielectric material 12, prepared using an ALD process to react and deposit the combination of one or more Group IIA metal precursor compounds of this invention, one or more Group VB metal precursor compounds, one or more titanium precursor compounds, and water vapor, for example, between two electrodes 14 and 16, typically made of platinum, iridium, ruthenium, ruthenium oxide, or rhodium. The bottom electrode 16 is typically in contact with a silicon-containing layer 18, such as an n-type or p-type doped silicon substrate. A conductive layer 20 is positioned between the bottom electrode 16 and the silicon-containing layer 18 to act as a barrier layer to diffusion of atoms such as silicon into the electrode and dielectric material.

Figure 2:
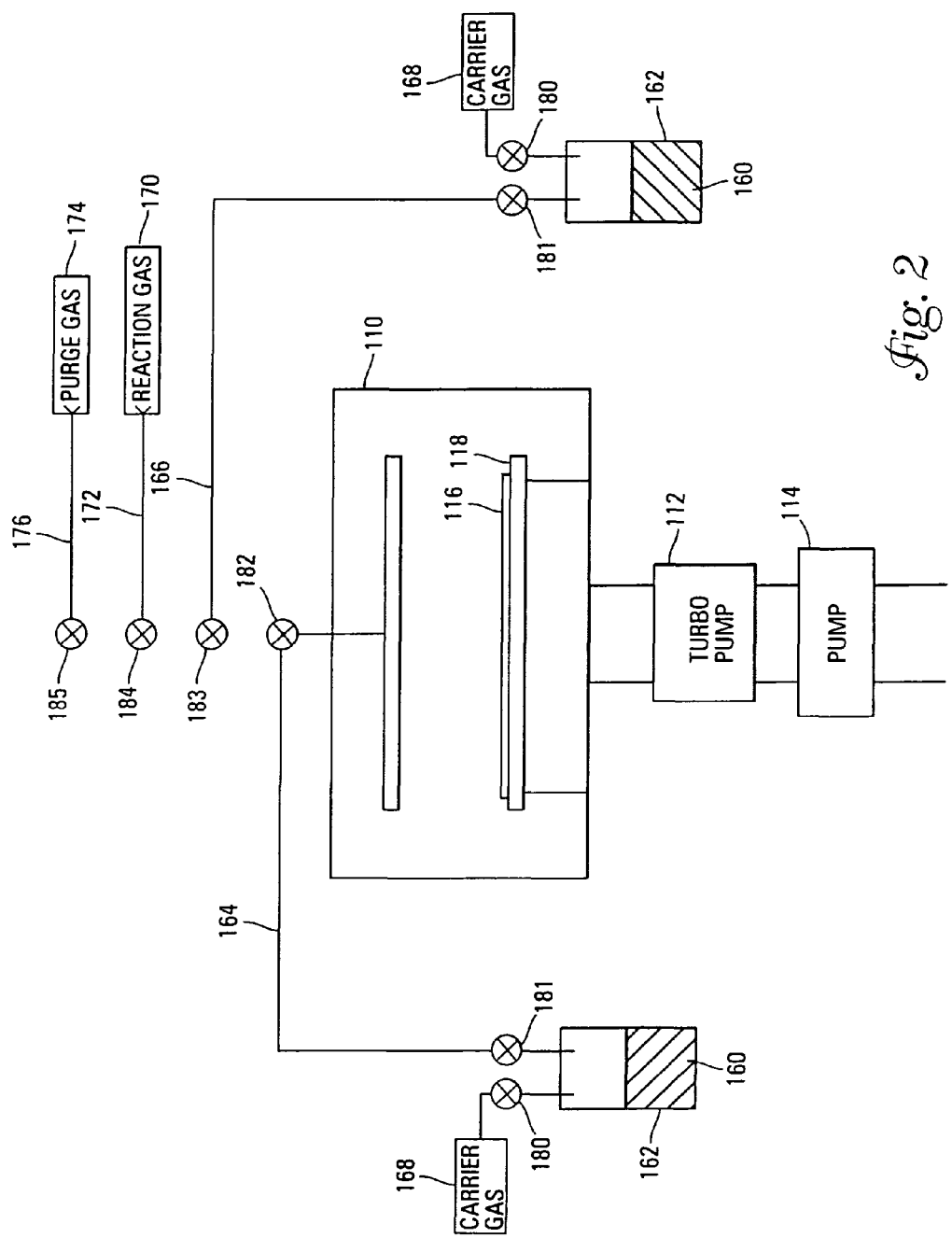
FIG. 2 is a perspective view of a vapor deposition coating system suitable for use in the method of the present invention.

A system that can be used to perform an atomic layer vapor deposition process of the present invention is shown in FIG. 2. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., Group IIA metal precursor compound and/or Group VB metal precursor compounds) are stored in vessels 162. The precursor compounds are vaporized and separately fed along lines 164 and 166 to the deposition chamber 110 using, for example, an inert carrier gas 168. A reaction gas 170 may be supplied along line 172 as needed. Also, a purge gas 174, which is often the same as the inert carrier gas 168, may be supplied along line 176 as needed. As shown, a series of valves 180-185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples.

EXAMPLES

Example 1

Atomic Layer Deposition of $SrTa_2O_6$

Separate reservoirs of the compounds $Sr[N(SiMe_3)_2]_2$ and tantalum pentafluoride are attached to a vapor deposition chamber and heated to 130° C. and 75° C., respectively. Lines and valves connecting the reservoirs to the chamber are maintained 20° C. above the reservoir temperature. The $Sr[N(SiMe_3)_2]_2$ remains solid; subliming into the vapor phase. The tantalum source melts at 97° C., but has sufficient vapor pressure at 75° C. The substrate is a silicon wafer which has been processed up to the bottom electrode of the capacitor. The substrate is on a heated stage held at 300° C. The chamber is pumped down to a base pressure of $10^{-5}$ torr before the ALD cycles are initiated and remains under dynamic vacuum for the duration of the deposition. The precursors are pulsed into the chamber using pneumatic actuated valves under computer control. A Sr-source pulse of 10 seconds is followed by a 1-second purge gas pulse of argon followed by a 30-second pump-down under vacuum. A 1-second water vapor pulse is then introduced from a water reservoir held at ambient temperature and the vapor controlled at 25 sccm through a mass flow controller. The water pulse is followed by a 1-second argon purge (controlled at 50 sccm), and then a 30-second pump-down. A Ta-source pulse is then introduced for 5 seconds followed by a 1-second argon purge followed by a 30-sec pump-down. Another water vapor pulse step the same as previous ends the complete cycle. This sequence is repeated for 300 cycles, yielding a $SrTa_2O_6$ film that is preferably approximately 250 Angstroms thick.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of forming a mixed metal oxide, comprising:
providing a semiconductor substrate or substrate assembly;
providing a first vapor comprising a first precursor having the formula $M_1(NRR')_2$, wherein R and R' are each independently an organic group and $M_1$ is selected from the group consisting of barium, strontium, calcium, and magnesium;
providing a second vapor comprising a second precursor that includes tantalum or niobium;
providing a third vapor comprising a third precursor comprising oxygen; and
directing the first, second and third vapors to the semiconductor substrate or substrate assembly to form an oxide comprising $M_1 M_2O$ using a vapor deposition process.

2. The method of claim 1 wherein the oxide has the formula $SrTa_2O_6$.

3. The method of claim 1 wherein the vapor deposition process is an atomic layer deposition process.

4. The method of claim 1 wherein the vapor deposition process is a chemical vapor deposition process.

5. The method of claim 1 wherein the second precursor is selected from the group consisting of metal halides, metal alkoxides, metal amides, metal imido-amides, metal carboxylates, metal alkyls and metal hydrides.

6. A method of mixed metal composition, the method comprising:
providing a semiconductor substrate or substrate assembly;
providing a first vapor comprising a first precursor having the formula $M_1(NRR')_2$, wherein R and R' are each independently an organic group and $M_1$ is selected from the group consisting of barium, strontium, calcium, and magnesium;
providing a second vapor comprising a second precursor having the formula $M_2X_5$; where $M_2$ is tantalum or niobium, and where X is fluorine, chlorine or bromine; and
directing the first and second vapors to the semiconductor substrate or substrate assembly to form a metal-containing layer on one or more surfaces of the semiconductor substrate or substrate assembly using a vapor deposition process; the metal layer comprising a mixture of $M_1$ and $M_2$.

7. The method of claim 6 wherein the second precursor is $TaF_5$.

8. The method of claim 7 wherein the first precursor is $Sr[N(SiMe_3)_2]_2$.

9. The method of claim 6 wherein the vapor deposition process is an atomic layer deposition process.

10. The method of claim 6 wherein the vapor deposition process is a chemical vapor deposition process.

11. A method of forming a mixed metal oxide, comprising:
providing a semiconductor wafer in a reaction chamber;
flowing a first vapor into the chamber, the first vapor comprising a first precursor having the formula $Sr[N(SiMe_3)_2]_2$;
flowing a second vapor into the chamber, the second vapor comprising a second precursor having the formula $TaF_5$;
flowing a third vapor into the chamber, the third vapor comprising water; and
the first, second and third vapors being in the chamber at substantially non-overlapping times relative to one another to form the mixed metal oxide $SrTa_2O_6$ over the semiconductor wafer.

* * * * *

UNITED STATES PATENT AND TRADEMARK OFFICE
CERTIFICATE OF CORRECTION

PATENT NO.         : 8,617,312 B2
APPLICATION NO.    : 11/521186
DATED              : December 31, 2013
INVENTOR(S)        : Brian A. Vaartstra et al.

Page 1 of 1

It is certified that error appears in the above-identified patent and that said Letters Patent is hereby corrected as shown below:

In the Claims:

In column 13, line 42, in Claim 1, delete "$M_1$ $M_2O$" and insert -- $M_1M_2O$ --, therefor.

Signed and Sealed this
Fifteenth Day of April, 2014

Michelle K. Lee
*Deputy Director of the United States Patent and Trademark Office*